United States Patent
Alvi et al.

(10) Patent No.: US 12,249,944 B2
(45) Date of Patent: Mar. 11, 2025

(54) IN-SITU INVERTER CAPACITANCE ANALYSES AND DEGRADATION ALERTS USING VARIABLE OPERATIONAL MODES OF ELECTRIC MOTOR

(71) Applicant: GM GLOBAL TECHNOLOGY OPERATIONS LLC, Detroit, MI (US)

(72) Inventors: Muhammad H. Alvi, Troy, MI (US); Khorshed Mohammed Alam, Canton, MI (US); Jiyu Zhang, Sterling Heights, MI (US); Chunhao J. Lee, Troy, MI (US); Brian A. Welchko, Oakland Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 249 days.

(21) Appl. No.: 17/989,824

(22) Filed: Nov. 18, 2022

(65) Prior Publication Data

US 2024/0171111 A1 May 23, 2024

(51) Int. Cl.
*H02P 29/028* (2016.01)
*H02P 27/08* (2006.01)

(52) U.S. Cl.
CPC ............ *H02P 29/028* (2013.01); *H02P 27/08* (2013.01)

(58) Field of Classification Search
CPC ................ H02P 29/028; H02P 27/08
USPC ........................................................ 318/139
See application file for complete search history.

(56) References Cited

U.S. PATENT DOCUMENTS

| | | | |
|---|---|---|---|
| 2009/0072982 A1* | 3/2009 | Cheng | G01R 27/2605 340/815.45 |
| 2009/0273236 A1* | 11/2009 | Broesse | H02J 7/1423 307/9.1 |
| 2015/0161829 A1* | 6/2015 | Julson | G01R 31/08 701/32.8 |
| 2017/0133837 A1* | 5/2017 | Hasan | H02H 9/001 |
| 2020/0195016 A1* | 6/2020 | Kimoto | H02J 7/345 |
| 2020/0363480 A1* | 11/2020 | Schnell | G01R 31/016 |

* cited by examiner

*Primary Examiner* — Kawing Chan
(74) *Attorney, Agent, or Firm* — Quinn IP Law

(57) ABSTRACT

Apparatus and techniques for analyzing a capacitance value in an electric motor inverter are disclosed. A processor is coupled to a DC-AC inverter, which includes a capacitor across its terminals and is powered by a battery. The processor performs resistor switching to enable singular, periodic measurement of the capacitance. The measured value is compared with a nominal or beginning of life (BOL) value. An alert may be sent if the capacitance has degraded beyond a threshold. In other aspects, the DC torque ripple envelop is used to measure capacitance. The outcome is compared with the other tests to assess consistency. An inconsistent outcome may identify potential resistor degradation.

20 Claims, 9 Drawing Sheets

IN-SITU INVERTER CAPACITANCE ANALYSES AND DEGRADATION ALERTS USING VARIABLE OPERATIONAL MODES OF ELECTRIC MOTOR

INTRODUCTION

An increasing number of commercial and industrial applications involve the use of alternating current (AC) motors for performing advanced functions. Present AC motors are often driven by a direct current (DC) to AC inverter for providing the needed phases of input current. The inverter includes a capacitor across its input terminals, which may be used with other elements to stabilize the input DC voltage and suppress parasitic voltage ringing and overshoot induced in the inverter when switching, for example. The presence and proper functioning of this capacitor is paramount. In many industrial machines, multiple inverters and motors may be used in the same apparatus, which creates a problem if any one of the capacitors begins to malfunction.

The capacitors used with inverters may be large and bulky, in part resulting from oversizing due to anticipated end-of-life degradation. Capacitor failure is one of the major causes of failure in AC electric motor applications. A gradual reduction in capacitance may lead to increased thermal stress of the battery, failure of other capacitors on the high voltage (HV) bus in use, and other problems. An undesired shift in resonance frequency of the circuit may also occur.

In the exemplary case of an electric vehicle (EV) or other commercial or industrial machine relying on the above configuration, present techniques lack the capability of the apparatus to monitor the integrity of the capacitor, especially after the EV or other machine has passed to the consumer. The result may be a subsequent failure of the apparatus using the motor, such as when the capacitance value deviates from its nominal or beginning of life (BOL) value during continued electric motor operation.

SUMMARY

Recognizing that loss of capacitance is an important indication of overall capacitor degradation and upcoming failure, principles of the present disclosure enable early and proactive monitoring and detection of capacitance across the inverter terminals. The disclosed early detection techniques may be used, among other benefits, to prevent catastrophic battery and overall EV failure, and to compensate for the resulting reduced operational performance of the EV.

In an aspect of the present disclosure, an apparatus includes a battery having first and second output terminals. The apparatus further includes an inverter having terminals coupled respectively to the first and second output terminals. The inverter includes a capacitor across the terminals and configured to power an electric motor. A processor is coupled to the inverter and configured to determine a capacitance value of the capacitor during a precharge phase when the electric motor is powered on and store the capacitance value in a memory. The determination and repeating is stored periodically. The capacitance value is compared with a nominal or beginning of life (BOL) value. An alert when the comparison meets or exceeds a threshold.

In various embodiments, the terminals include a first terminal selectively coupled to the first output terminal and a second terminal coupled to the second output terminal. The processor may include a first input for receiving an input voltage across the terminals. The processor may further be configured to switch the first output terminal to the first terminal via a precharge resistor. The processor may determine the capacitance value based on a time between (i) switching the first output terminal from a disconnected state to the first terminal via the precharge resistor and (ii) the input voltage rising from an initial value to a product of a first time constant and a final value. The processor may further use a resistance value of the precharge resistor.

In various embodiments, the capacitance value $Cp=\tau/Rp$, where $i$ is the first time constant and $Rp$ is the resistance value of the precharge resistor. The apparatus may further include a comparator coupled to the inverter and configured to determine a time at which the input voltage reaches the expected value at the first time constant $e^{-1}$. The precharge phase may be configured to begin when the processor switches the first output terminal from the disconnected state to the first terminal via the precharge resistor.

In various embodiments, during the precharge phase, $V_{CAP}=V_{BAT}-V_{BAT}e^{-t/RpC}$, wherein $V_{CAP}$ is a voltage across the first and second terminals of the capacitor, $V_{BAT}$ is a voltage across the first and second output terminals of the battery, $Rp$ is a value of the precharge resistor; and $C$ is the determined capacitance value. The processor may further be configured to selectively modify each of the determined capacitance values based on a measured temperature during the determination.

Upon repeating the determination two or more times during key on or key off, the processor may also be configured to conduct a trend analysis, the trend analysis comprising comparing the capacitance value with the nominal value and storing each of the results in memory to determine whether a trend is present.

In another aspect of the disclosure, an apparatus includes a battery having first and second output terminals. The apparatus further includes an inverter having terminals coupled respectively to the first and second output terminals. The inverter includes a capacitor across the terminals and configured to power an electric motor. The processor coupled to the inverter and configured to determine a capacitance value of the capacitor during a discharge phase when the electric motor is powered off and store the capacitance value in a memory. The processor is further configured to repeat the determination and the storing periodically. The processor compares the capacitance value with a nominal or beginning of life (BOL) value. The processor generates an alert when the comparison meets or exceeds a threshold.

In various embodiments, the terminals include a first terminal coupled to the first output terminal and a second terminal coupled to the second output terminal. The processor may include a first input for receiving an input voltage across the terminals. The processor may further be configured to switch a discharge resistor to connect between the first and second terminals and determine the capacitance value based on a time between (i) switching the discharge resistor to connect between the first and second terminals and (ii) the input voltage falling from an initial value to a final value. The final value is equal to a difference between the initial value and an amount equal to an expected value at a first time constant. The processor further may use a resistance value of the discharge resistor.

In various embodiments, the capacitance value $Cd=\tau/Rd$ where $\tau$ is the first time constant and $Rd$ is the resistance value of the discharge resistor. The discharge phase may be configured to begin when the processor switches the discharge resistor to connect between the first and second terminals. During the discharge phase, $V_{CAP}=V_I e^{-t/RdC}$, wherein $V_{CAP}$ is a voltage across the first and second terminals of the capacitor, $V_I$ is the initial value of $V_{CAP}$ before the discharge resistor is switched to connect between the first and second terminals, Rd is a value of the discharge resistor; and C is the determined capacitance value.

In various embodiments, the processor is further configured to inhibit a fast discharge through a motor winding when switching the discharge resistor to connect between the first and second terminals. The processor may further be configured to selectively modify each of the determined capacitance values based on a measured temperature during the determination. Upon repeating the determination periodically, the processor is configured to conduct a trend analysis, the trend analysis comprising comparing the capacitance value with the nominal value and storing each of the results in memory to determine whether a trend is present.

In yet another aspect of the disclosure, an apparatus includes a battery having first and second output terminals for producing a direct current (DC) voltage. The apparatus also includes an inverter having terminals coupled respectively to the first and second output terminals. The inverter includes a capacitor across the terminals and configured to generate an alternating current (AC) for powering an AC electric motor. A processor is coupled to the inverter and configured to identify an operating point of the motor including a motor torque and speed. The processor may detect a DC voltage ripple envelope from the capacitor with the motor at the operating point. The processor may repeat the determination periodically. The processor may store the DC ripple envelope in the memory, compare the DC ripple envelope with a nominal value, and generate an alert when the comparison meets or exceeds a threshold.

In various embodiments, the processor may be further configured to conduct a first comparison between a first measured value of the capacitor when the motor is powered up using a precharge resistor and a nominal value to determine if a first threshold is exceeded. The processor may conduct a second comparison between a second measured value of the capacitor when the motor is powered down using a discharge resistor and the nominal value to determine if a second threshold is exceeded. The processor may compare results of the first and second comparisons with the comparison of the DC ripple envelope to determine whether the three comparisons are in agreement. The processor may identify a problem with the capacitor when the tests are in agreement. The processor may, however, identify a problem with the precharge or discharge resistors when the tests are not in agreement.

In various embodiments, the nominal value of the capacitor may either be the same across the three comparisons, or different across at least two comparisons. Further, values of the threshold, the first threshold, and the second threshold may either all be the same, or at least two may be different.

The above summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes the various combinations and sub-combinations of the elements and features presented above and below.

BRIEF DESCRIPTION OF THE DRAWINGS

The accompanying drawings, which are incorporated into and constitute a part of this specification, illustrate implementations of the disclosure and together with the description, explain the principles of the disclosure.

Figure 1:
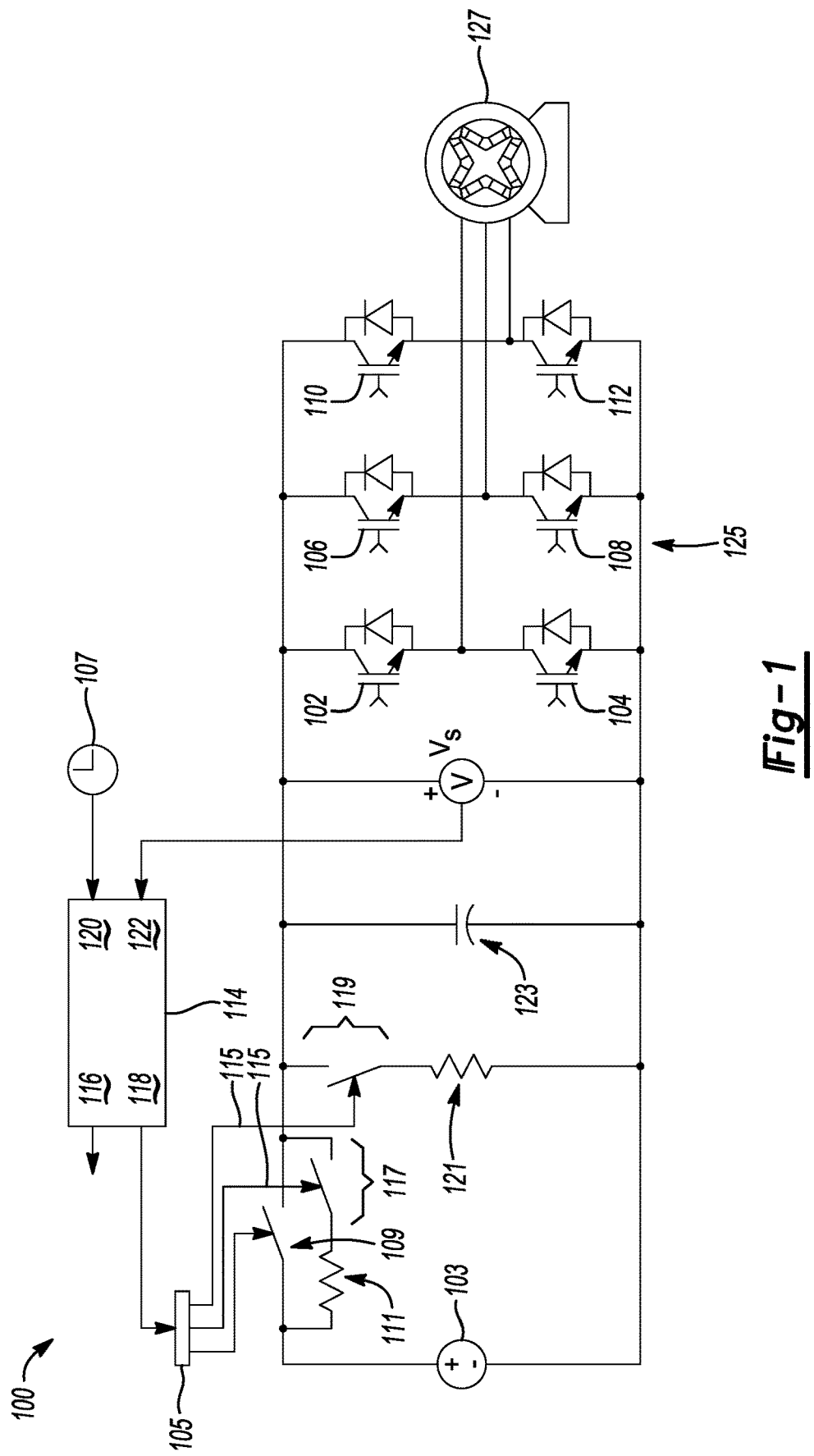
FIG. 1 is a circuit diagram of a DC/AC inverter coupled to a processor, battery and AC electric motor, in accordance with various embodiments.

The appended drawings are not necessarily to scale and may present a simplified representation of various preferred features of the present disclosure as disclosed herein, including, for example, specific dimensions, orientations, locations, shapes and scale. Details associated with such features will be determined in part by the particular intended application and use environment.

DETAILED DESCRIPTION

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including," "containing," "comprising," "having," and the like shall mean "including without limitation." Moreover, words of approximation such as "about," "almost," "substantially," "generally," "approximately," etc., may be used herein in the sense of "at, near, or nearly at," or "within 0-5% of", or "within acceptable manufacturing tolerances", or logical combinations thereof. As used herein, a component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function.

The principles of the present disclosure are directed to an apparatus that may, among other benefits, maintain the integrity of the primary capacitor across the DC-AC inverter ("inverter"). The inverter may receive a direct current (DC) voltage from a battery source and may convert that current to an alternating current (AC) for powering the windings of one of the various types of AC electric motors. The apparatus may include a processor configured to control switches for the time period when the AC electric motor 127 is powered on (referenced sometimes herein as "key on") or for the time period when the AC electric motor 127 is powered off (referenced sometimes herein as "key off").

Referring to the drawings, wherein like reference numbers refer to like features throughout the several views, FIG. 1 is a circuit diagram 100 of a DC/AC inverter 125 coupled to a processor 114, battery 103 and AC electric motor 127, in accordance with various embodiments. The inverter 125 in this embodiment includes a plurality of power transistors 102, 104, 106, 108, 110 and 112. While three chains of power transistors are shown here, the number of chains (e.g., transistors 102 and 104) may vary depending on the design of inverter 125. The inverter converts DC power from battery 103 to poly-phase AC power to drive an electric motor, such as during acceleration in an EV application. The AC power may also be converted back to DC in some applications, such as in some EVs during regenerative braking, thereby charging the battery. The power transistors may include the various available configurations such as, for example, bipolar junction transistors (BJTs), power metal-oxide-semiconductor field-effect transistors (power MOSFETs), static induction transistors (SITs), insulated gate BJTs (IGBJTs), and many others, including different semiconductors from silicon. As an example, each transistor chain (e.g., transistors 102 and 104) may include an NPN IGBJT transistor 102 and a PNP IGBJT transistor 104). In the exemplary embodiment of FIG. 1, the three output stages of the three inverter chains (i.e., transistors 102 and 104, transistors 106 and 108, and transistors 110 and 112) are input as three different phases of alternating current to three different sets of windings in the AC electric motor 127. Numerous other configurations are possible, and the simplified configuration in FIG. 1 is shown to avoid unduly obscuring the concepts of the disclosure with unnecessary detail that is already appreciated by those skilled in the art.

Electric motor 127 may be any AC electric motor, including without limitation an induction motor, a synchronous reluctance motor, a permanent magnet motor, and the like. In addition to the transistor chains, the inverter includes a DC capacitor 123 (referenced herein as just a capacitor) across the terminals of the inverter. The capacitor 123 may be used to stabilize the inverter input voltage to help produce a smooth sinusoidal current at the output of the inverter to reduce high-frequency artifacts in the electric motor 127. The capacitor 123 may also be used along with different resistors to key on and key off the engine while smoothly ramping the inverter input voltage. The capacitor 123 is also used for mitigating high-frequency torque ripple or pulsating current arising from transistor switching, and other voltage transients due to various phenomena.

The inverter 125 includes in this embodiment a voltage sensor $V_S$, which senses the voltage across the terminals of the inverter and provides the voltage to an input of a processor 114. The inverter 125 is powered by a battery 103 which is coupled to the inverter's input via the positive and negative terminals of battery 103. In some embodiments, the positive or the first output terminal of the battery 103 is selectively coupled to a first terminal of the inverter 125 that coincides with the positive terminal of voltage sensor $V_S$ and one of the terminals of the capacitor 123. The negative or the second output terminal of the battery 103 is coupled to a second terminal of the inverter 125 that coincides with the negative terminal of $V_S$ and the remaining terminal of capacitor 123. In some embodiments, the capacitor 123 may instead be a plurality of parallel capacitors, which are configurations that fall within the scope of the present disclosure.

The processor 114 may be used to make measurements and detections, and to control various switches as described more fully herein. The processor 114 may in some arrangements include more than one processor or controller. Processor 114 may include one or more central processing units. The functions performed by processor 114 may be performed in software, hardware, firmware, or a combination thereof. Thus, the processor itself may vary widely in its architecture. The processor 114 may include one or more general purpose processors, special purpose processors, complex instruction set computer (CISC) processors, reduced instruction set computer (RISC) processors. The processor 114 may include any number of cores and may include cache memory, busses, registers, and other similar processor components. In other cases, some or all of the functions may be performed in hardware. Thus processor 114 may include one or more digital signal processors (DSPs). systems-on-a-chip (SoCs), field programmable gate arrays (FPGAs), application-specific integrated circuits, dedicated logic circuits or any similar circuit for implementing functions in hardware, CPU(s) for executing code, or some combination thereof. If some or all functions are performed in software, the software may include or involve middleware, firmware, application programming interfaces or any other type of code. In some embodiments, processor 114 is part of a separate computer, used in tandem with the inverter 125, electric motor 127, battery 103, and associated matrix of switches as described further below.

The processor 114 may also include a memory while, although not explicitly shown, may store information in the form of any suitable memory. For convenience and simplicity, the processor 114 is deemed in FIG. 1 to include the memory, although in other embodiments, the memory may be physically separate from the processor. The memory may include virtually any computer-readable medium including, but not limited to, for example, solid state memory, flash memory, a hard disk drive, a magnetic drive, read only memory (in part), random access memory (RAM), static RAM dynamic RAM, cache memory, etc. Information input into processor 114 may be stored, temporarily or permanently for future use.

Referring still to FIG. 1, processor 114 may include an input 120 coupled to a clock 107, which may be a crystal oscillator or similar stable clock signal. The input 120 (or another input) may additionally or alternatively receive an actual clock input in which a time and date may be provided to the processor for recording purposes. In some embodiments, the clock information may be internal to the processor 114. For example, the processor 114 may be programmed to perform a function periodically on a specific time and date, or after passage of a specified time period. The processor in any of these embodiments has the necessary timing information in its possession and may perform the specified function accordingly.

The processor 114 further includes an input 122 coupled to $V_S$, the voltage across the terminals of the inverter, such that the processor 114 is provided with the voltage across the capacitor 123. The processor 114 also includes an output 116 for providing measured capacitance values as detailed below. The processor 114 further includes an output 118. Output 118, which in some embodiments may be a plurality of outputs, is used to control various switches 109, 117 and 119 in an overall system that may include, in part or in whole, inverter 125. For example, output 118 may in some embodiments include one or more outputs coupled individually to the switches for controlling their state. In other embodiments, output(s) 118 of processor 114 may be coupled to a switch controller 105, which in turn may be used to control the state of the respective switches. In related configurations, the switching logic may reside within the processor 114 with multiple outputs coupled to the respective switches 109, 117 and 119 of the inverter 125 to open or close the switches.

With reference back to the circuit including the inverter 125 of FIG. 1, the inverter system 125 includes a precharge resistor 111 and a discharge resistor 121. The relevance of the resistors 111 and 121 to the inverter 125 at any given time depends on the state of the three switches 109, 117 and 119. For example, during regular operation of the motor, the processor 114 may maintain switch 109 closed with switches 117 and 119 open. This configuration occurs during steady-state operation of the electric motor 127, when the first (positive) and second (negative) terminals of the battery are respectively directly connected to the first (positive $V_S$) and second (negative $V_S$) terminals of the inverter 125. In some embodiments, switch 119 may not be present. In fact, the inverter system overall may include a number of different configurations using different numbers and positions of switches and other elements, each configuration of which is intended to fall within the spirit and scope of the present disclosure.

The inverter system 125 may include a resistor 111 that may be used in conjunction with the capacitor 123 a precharge phase when the electric motor 127 is powered on—that is to say, during a key on event. The inverter 125 may also include a resistor 121, which may separately be used in conjunction with the capacitor 123 in a discharge phase when the electric motor 127 is powered off in a key off event. When the processor 114 closes the switch 117 (via switch controller 105 or directly) while switches 109 and 119 remain open, the combined capacitor 123 and precharge resistor 111 collectively prevent in rush currents and prevent the inverter voltage $V_S$ from spiking immediately up to the high voltage of the battery to thereby avoid damaging the circuit or associated HV bus. In addition, the precharge resistor 111 may be used to enable precise determination and monitoring of the capacitance value of capacitor 123. Similarly, when the electric motor is in a key off mode—or during discharge when the electric motor is powered off—the inhibition of fast discharge through the motor winding(s) may be performed. In addition, when the processor closes switch 119 while maintaining switches 109 and 117 open, the high voltage on the bus may slowly and controllably discharge through the RC circuit. Further, in this circuit configuration, the discharge resistor forms a circuit that may also be used to enable precise measurement of the capacitance value of capacitor 123.

As such, in one aspect of the disclosure, the capacitance value of capacitor 123 may be proactively determined during a precharge phase when the electric motor is powered on. The capacitance value may be measured singularly or periodically as deemed suitable (the latter measure to perform a trend analysis). The capacitance value may be stored in a memory and compared with one or both of a (1) nominal value in memory and obtained initially at the factory by referencing the specification sheet for the capacitor, and/or a (2) beginning of life (BOL) value determined in manufacturing, by reference to the specification, measurement or otherwise. In other embodiments, periodic determination via measurement of the capacitance values may be made across a known timeline using key on capacitor precharge, a key off capacitor discharge, and separately, a tracking of the inverter voltage ripple envelope during a known operating point of the electric motor (typically a high ripple torque operation). These procedures enable a robust and reliable functionality check, thereby ensuring the integrity of other components on the same HV bus. In various embodiments, the processor may selectively modify each of the determined capacitance values based on a measured temperature during the determination, meaning that the process may compensate for different temperature values that may be present across different measurements. Examples include when the electric motor is first turned on after a cold night at one extreme, versus when the electric motor is turned off after a long period of operation on hot day, at another extreme.

Figure 2A:
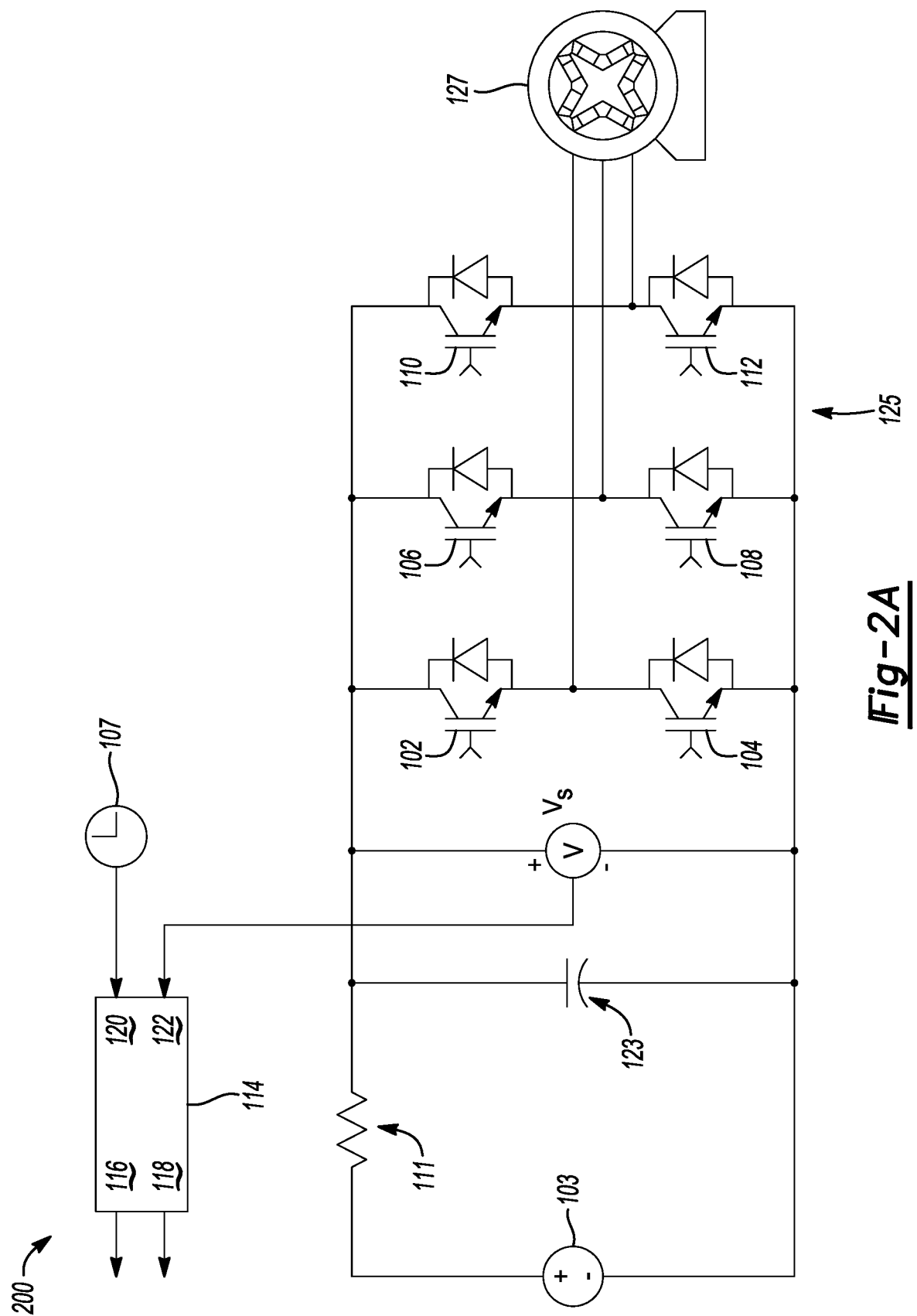
FIG. 2A is the apparatus of FIG. 1 with the processor switched to include a precharge resistor in series with the battery during a key on operational phase, in accordance with various embodiments.

FIG. 2A is the apparatus 200 of FIG. 1 with the processor 114 switched to include the precharge resistor 111 in series with the battery 103 during a key on operational phase, in accordance with various embodiments. Initially it may be noted that the power transistors 102, 104, 106, 108, 110 and 112 of inverter 125 and the electric motor 127 are not yet operational in the sense that the motor is just being turned on. Because only switch 117 has been closed with the others open, or because of the high value discharge resistor is assumed to be not part of the circuit. For both of these reasons, the precharge resistor 111 and the capacitor 123 may be modelled as the RC charging circuit at the contactor turn on (here, the closing of switch 117 immediately after all switches 109. 117 and 119 are open). At this instant, the precharge voltage across the capacitor is governed by the following equation:

$$V_{CAP} = V_{BAT} - V_{BAT} e^{-t/RPC},$$

where:
  $V_{CAP}$ is the voltage across the capacitor 123;
  $V_{BAT}$ is the voltage across the battery 103;
  Rp is the value of the precharge resistor 111; and
  C is the determined capacitance value of capacitor 123.

With reference to the above equation, the clock 107 provides the processor 114 with the timing information needed, such that the initial 0 time may be the contactor (switch 117) turn on. The value of the precharge resistor 111 is also used in the equation as part of the RC network. That value may be precisely determined through data sheets and/or measurements at time of manufacture of the apparatus, and stored in the memory (e.g., the memory in processor 114 or a separate memory connected thereto). The voltage across the battery 103 is known. Because the resistor 111 at the positive terminal of the battery is selectively coupled to the first terminal (positive $V_S$) of the capacitor, $V_{CAP}$ in this instance will not be identical to V BAT until the capacitor is fully charged. The value of C may be calculated by the processor 114 using the above equation.

The processor, having closed the contact and engaged the resistor 111 with capacitor 123, may thereby determine a capacitance value of the capacitor 123 during a precharge phase at the time when the electric motor 127 is powered on. The capacitance value may be stored in the memory. The processor 114 may repeat the determination and the storing of the value periodically, for example. In one embodiment, a ten (10) kilohertz (kHz) measurement sampling by the processor 114 of the voltage $V_S$ across the capacitor 123 may occur such that precise values for the corresponding capacitance may be determined.

Storing the value periodically may in some embodiments be for purposes of conducting a trend analysis to determine whether the capacitor value is rapidly changing (e.g., reducing) so that appropriate corrective action may be taken. Otherwise, the processor 114 may compare each measured capacitance value with a nominal or beginning of life (BOL) value originally stored in memory when the apparatus was being manufactured. The processor may thereupon generate an alert when the comparison meets or exceeds a threshold. The threshold may be selected on the basis that the value of the capacitor has reached a point where a noticeable degradation in performance is inevitable, for example.

Figure 2B:
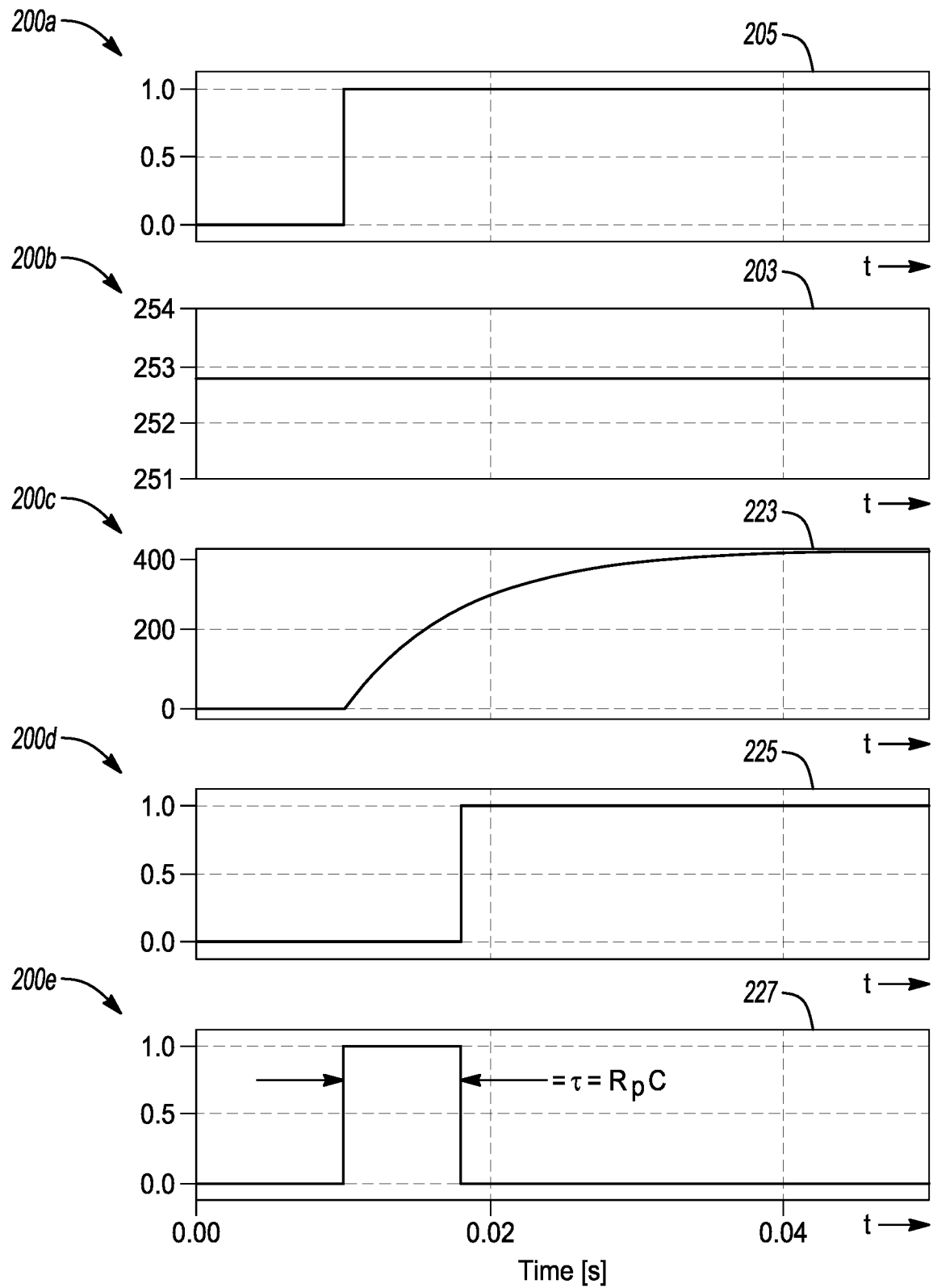
FIG. 2B is a series of timing diagrams showing electrical characteristics of the apparatus of FIG. 2A changing during precharge, in accordance with various embodiments.

FIG. 2B is a series of timing diagrams showing electrical characteristics of the apparatus of FIG. 2A changing during precharge, in accordance with various embodiments. Referring first to diagram 200a, key on is represented when the motor turns on at 205. Switch 117 is closed at this point as the switching controller 105 turns on to engage the resistor 111. Diagram 200b shows the battery voltage multiplied by the per unit expected value of the first time constant (approximately 0.632), which in turn is approximately 252.8 volts. The first time constant $\tau=RC$, where R is the value of the precharge resistor and C is the capacitance of the capacitor 123.

Referring to diagram 200c, the rising voltage of the capacitor 123 is shown as it exponentially increases according to the above-noted differential equation. The maximum voltage in this embodiment is about 400 volts. Diagram 200d shows the processor 114 and its logical "1" input at the time the voltage of capacitor 123 reaches a value equal to a product of the voltage of the battery 103 and the step response expected at the first time constant $\tau$, or approximately 253 volts. Diagram 200e thereupon shows the pulse width for the first time constant $\tau$—namely, the time in this example it takes for the processor 114 to turn on the switch 117 to the time the voltage of capacitor 123 reaches $(1-e^{-1})$ or about 63.2% of the final value (which may vary depending on the size of the capacitor, the circuit, the overall apparatus, and other factors) of about 253V. Thus, the pulse width generated by processor 114 as a function of the initial switch to the battery 103 via precharge resistor 111 (diagram 200a) to the capacitor voltage reaching the final value times 63.2% is shown in diagram 200e as the time taken to reach $\tau=RpCp$. The pulse width in diagram 200e may be used within the digital circuits (or software) of processor 114 to determine the capacitance of the inverter capacitor 123 by solving for Cp=$\tau$/Rp, where $\tau$ is the first time constant and Rp is the resistance value of the precharge resistor 111.

Once precharge is completed, the controller 114 may then close switch 109 to commence steady-state inverter/motor operation. Here, the battery is connected across the capacitor and the rest of the inverter 125, and the motor operates under normal conditions as it receives the AC poly-phase input current from the inverter 125. Resistors 111 and 121 may be eliminated from the circuit operation as the apparatus operates.

The above calculation made by the processor 114 during precharge may be made in various ways. For example, it may be under the control of the driver to verify operation every so-often the motor is turned on. In other embodiments, the entire process may be automated, meaning that the processor 114 will make the above measurement every nth key on event, such as every ten times the motor is turned on. More aggressively, in a trend analysis, the measurement may be made more often, such as during every key other key on, every key on, or the like. When the trend suggests proper operation, the operator of the electric motor 127 may continue to use the system. When the trend indicates a degradation of the capacitance value, proactive operation may be undertaken to replace the capacitor and continue use.

Figure 3A:
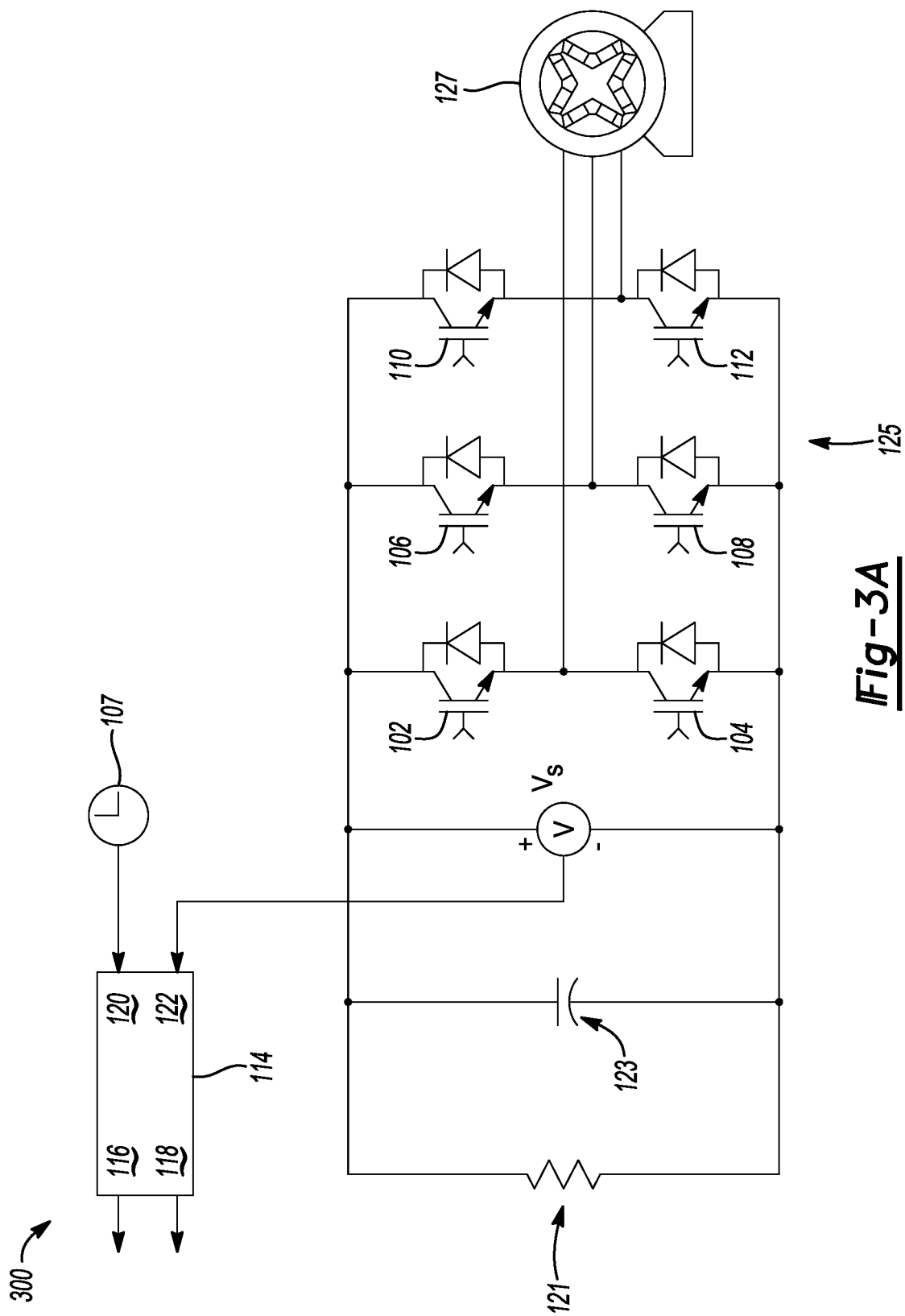
FIG. 3A is the apparatus of FIG. 1 with the processor switched to include a discharge resistor in parallel with the capacitor during a key off operational phase, in accordance with various embodiments.

In other embodiments, the accuracy of the measurements obtained by determining the capacitance value of the capacitor 123 may be verified, or autonomously calculated in another measurement, via use of the discharge resistor 121. This latter measurement may be made at key off, such as when the electric motor 127 is turned off. To this end, FIG. 3A is the apparatus of FIG. 1 with the processor 114 switched to include the discharge resistor 121 in parallel with the capacitor 123 during a key off operational phase, in accordance with various embodiments. Referring briefly back to FIG. 1, after the electric motor 127 has been running for some time, the operator of the apparatus (e.g., the driver of the vehicle in an EV case) may elect to turn off the electric motor 127 and stop using the EV, e.g., as a matter of course.

Accordingly, the process begins with the processor 114 or other device inhibiting, on key off or when the motor is powered off, a rapid voltage/current decrease through one of the motor windings. This objective may be achieved using various means. After a fast discharge through the motor winding(s) is inhibited, discharge may be implemented through the processor 114.

Referring still to FIG. 3A, when the electric motor is powered off, a similar determination or set of determinations may be made for determining the capacitance value of capacitor 123. Processor 114 or switch controller 105 may decouple switch 109. Processor 114 may connect switch 119 such that discharge resistor 121 is part of the RC circuit for reducing the voltage across capacitor 123. During this period in which resistor 121 is connected in parallel with capacitor 123, the apparatus 300 may be free to discharge. Periodically or consistently when the apparatus 300 discharges, the capacitance value may be determined again. For example, the voltage across the capacitor (as measured by $V_S$) is input to the processor 114 for monitoring $V_C$. The clock 107 is still input to the time input 120 of processor 114 for evaluating the times at which relevant events occur. The discharge resistor 121 and the capacitor 123 may be modelled in this case as an RC discharging circuit when the motor turns off at the switching to discharge resistor 121. The RC discharging portion of the apparatus 300 is now governed by the following equation:

$$V_{CAP}=V_I e^{-t/RdC}, \text{ where} \qquad [32.1]$$

$V_{CAP}$ is a voltage $V_S$ across the first and second terminals of the capacitor $V_I$ is the initial value of $V_{CAP}$ before the discharge resistor is switched to connect between the first and second terminals;

Rd is a value of the discharge resistor; and

C is the determined capacitance value.

As in previous embodiments, the value of the discharge resistor 121 is used to compute the desired capacitance value C. Thus, the resistance of resistor 121 is stored in the memory at the factory (whether through datasheets or direct measurement) in the memory. \

Figure 3B:
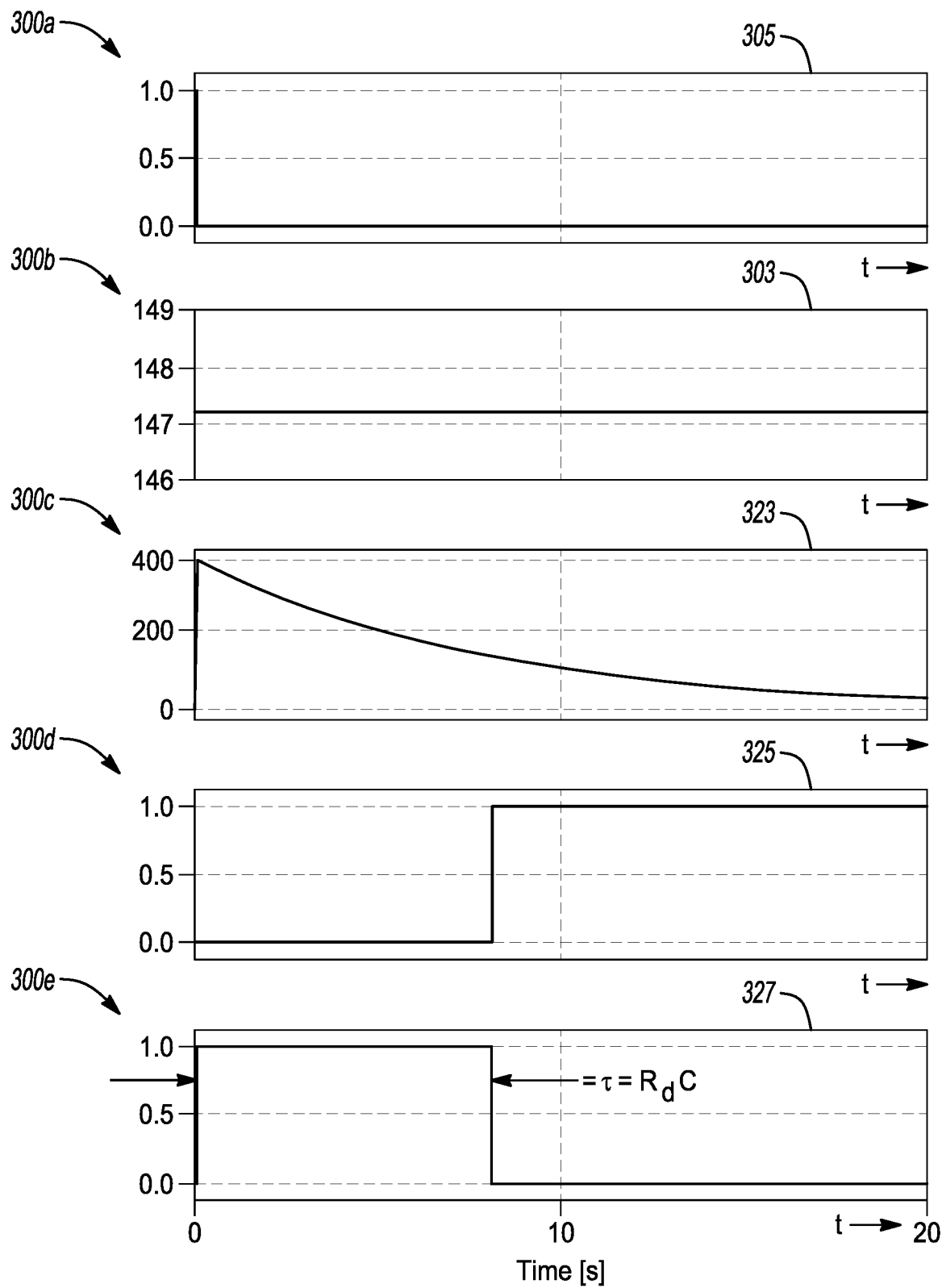
FIG. 3B is a series of timing diagrams showing electrical characteristics of the apparatus of FIG. 3A changing during discharge, in accordance with various embodiments.

FIG. 3B is a series of timing diagrams showing electrical characteristics of the apparatus of FIG. 3A changing during discharge, in accordance with various embodiments. Again, the horizontal axes of each of the diagrams is time. Referring first to diagram 300a, the battery contactor voltage 305 (vertical axis) is shown. The voltage reduces to from a logic "one" to a logic "zero" at time zero. Using the example apparatus of FIG. 3A, diagram 300a in FIG. 3B shows that processor 114 opens switch 109, and then the processor closes switch 119 (FIG. 1) to turn off the electric motor 127 at t=0. Thus, the resistor 121 is engaged and the battery 103 is disengaged.

The role of resistor 121 during key off is to facilitate a safe discharge. When the apparatus is keyed off, and the first and second output terminals of the battery 103 open, the apparatus has the initial voltage 323 (vertical axis) of 400 volts across the capacitor 123, as shown in diagram 300c. In the case of a discharging circuit, the time constant of a resistor-capacitor series combination is defined as the time it takes for the capacitor to deplete about 36.8% of its charge. This value is about 147.2 volts in diagram 300b, which shows the product 303 (vertical axis) of the battery voltage (about 400 volts) and 0.368.

Referring back to diagram 300c, the capacitor then discharges through the resistor 121 via the time constant of the RC combination, and in accordance with the above equation [32.1]. The first diagram shows that the battery contactor is open, so any energy on the DC capacitor drains through the discharge resister.

During the discharge, the voltage of capacitor 123 in diagram 300c now reduces from the initial value of about 400 volts towards a final value near V=0, as per equation [32.1]. However, less than halfway through the time axis in this example, the capacitor voltage 123 reaches the first time constant $\tau$=CdRd, where Cd equals the capacitance value of the capacitor 123 (in this case, as it is discharging) and Rd is the value of resistor 121 pre-stored in memory. Referring to diagram 300e, the pulse width 327 (vertical axis) for the first time constant $\tau$=CdRd is shown, and $\tau$ is known. Having the nominal or BOL value of Rd already stored in memory, the capacitance value of capacitor 123 may readily be determined. In some embodiments, the apparatus includes a comparator circuit used to produce the pulse based on the initial time the battery contactor engaged the resistor 121 until the time when a value corresponding with the first time constant has been achieved.

While the first time constant is used in these examples, other time constants may be used to determine the capacitance. One advantage of the first time constant is that at its value of $e^{-1}$~0.632, t=RC when $V_{CAP}$=initial value×0.632. The value of the resistor 121 (discharge resistor) may vary, but in one embodiment is about 8 k$\Omega$ or higher. Based upon the values sent to the processor 114, switching decisions may be made. Another advantage of using the first time constant is that the discharge-based measurement of the capacitor 123 need not be initiated precisely when $V_{CAP}$=400 volts. The determination of the capacitance value is valid when $V_{CAP}$=another value times the $e^{-1}$. Thus, the processor 114 may defer the measurement if noise is detected across the capacitor, for example.

Measurements upon discharge may be repeated. For example, the determination of the capacitance value may be made periodically, after every nth key off, where n=10. The capacitance values may be stored in memory and compared with the known nominal or BOL value. In some embodiments, the multiple capacitance values may be used to compute an overall capacitance value, such as an average, medium, or mean value. In other cases, a trend analysis may be performed by making periodic measurements of the capacitance values during various stages of discharge. The trend analysis may quickly determine whether the capacitance value is on the path to degrading, for example. The processor 114 may generate an alert when the comparison meets or exceeds a threshold value, e.g., pre-stored in memory at the manufacturing facilities.

Figure 4:
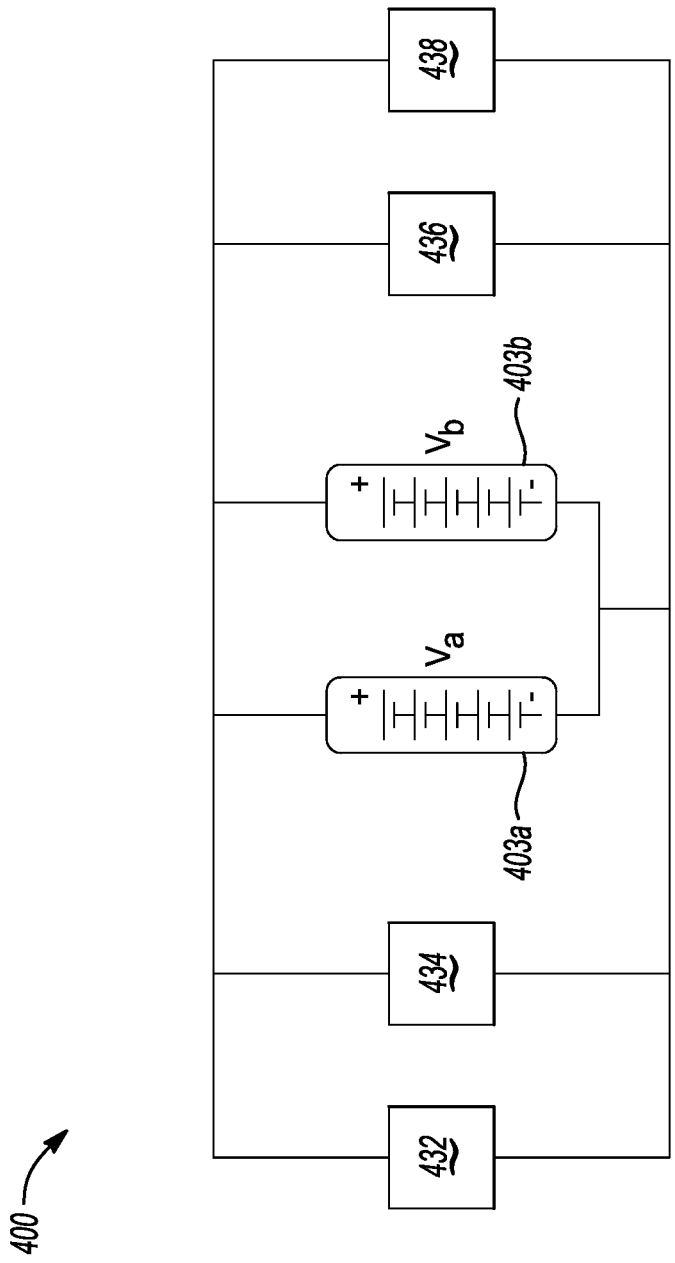
FIG. 4 is a block diagram of an electric vehicle apparatus including batteries and inverter modules connected in parallel therewith, in accordance with various embodiments.

FIG. 4 is a block diagram of an electric vehicle apparatus 400 of batteries and inverter modules connected in an electric vehicle, in accordance with various embodiments. The apparatus 400 includes two batteries 403a and 403b that respectively output Va and Vb. The apparatus further includes four power inverter modules 432, 434, 436, and 438, but other numbers of inverters are also possible. Each inverter in this example includes a DC capacitor whose performance problems may adversely affect other modules on the same HV bus. In various embodiments, one or more processors or circuit devices may be used to measure the capacitance values across the different inverters. Advantageously, the principles of the present disclosure may be scaled-up to provide each of the inverters with mechanisms for measuring capacitance values and alerting the consumer when a problem is found, along with codes in some embodiments having precise diagnoses of the problems and the appropriate corrective action to be taken by those skilled in the art.

Resistor Fault Detection Apparatus. Referring back to the example apparatus 100 shown in its various precharge and discharge configurations of FIGS. 1, 2A and 3A, in another aspect of the disclosure, an aggregated precharge and discharge resistor fault detection system is disclosed. The discharge and precharge events of the capacitor 123 in an inverter as discussed at length above may be critical in many applications, including the use of such apparatuses in EVs. In some cases, specifications may be sixty seconds to 50 volts in a typical scenario and they may be much more aggressive in potential collision events. In various embodiments, the same capacitance measurement apparatus as described in the embodiments herein may be utilized to verify the functionality of the precharge and discharge system and ensure that the latter system is operating within its specifications. The verification and sensing operations performed by processor 114 and switching controller 105 is valid for either active or passive discharge systems. Accordingly, in some embodiments, a deteriorating discharge or precharge resistor (e.g., resistor 121 and resistor 111, respectively) may be diagnosed. That is, using similar techniques discussed further below with reference to FIGS. 5 and 8, the active or passive discharge mechanism as well as the precharge system may be checked by analyzing the voltages. The active discharge functionality verification may be particularly important due to the semiconductor presence.

A relevant criterion in verifying the functionality of the precharge and discharge systems is the voltage across the inverter capacitor. That voltage has already been measured for purposes of calculating the capacitance value when the motor is turned on (precharge) or off (discharge). In an embodiment, the sample rate of the voltage sensing on the capacitor may be increased during motor operation to determine the corresponding ripple across the capacitor. The ripple envelope is correlated with the capacitor 123 and increases with capacitor degradation.

Figure 5:
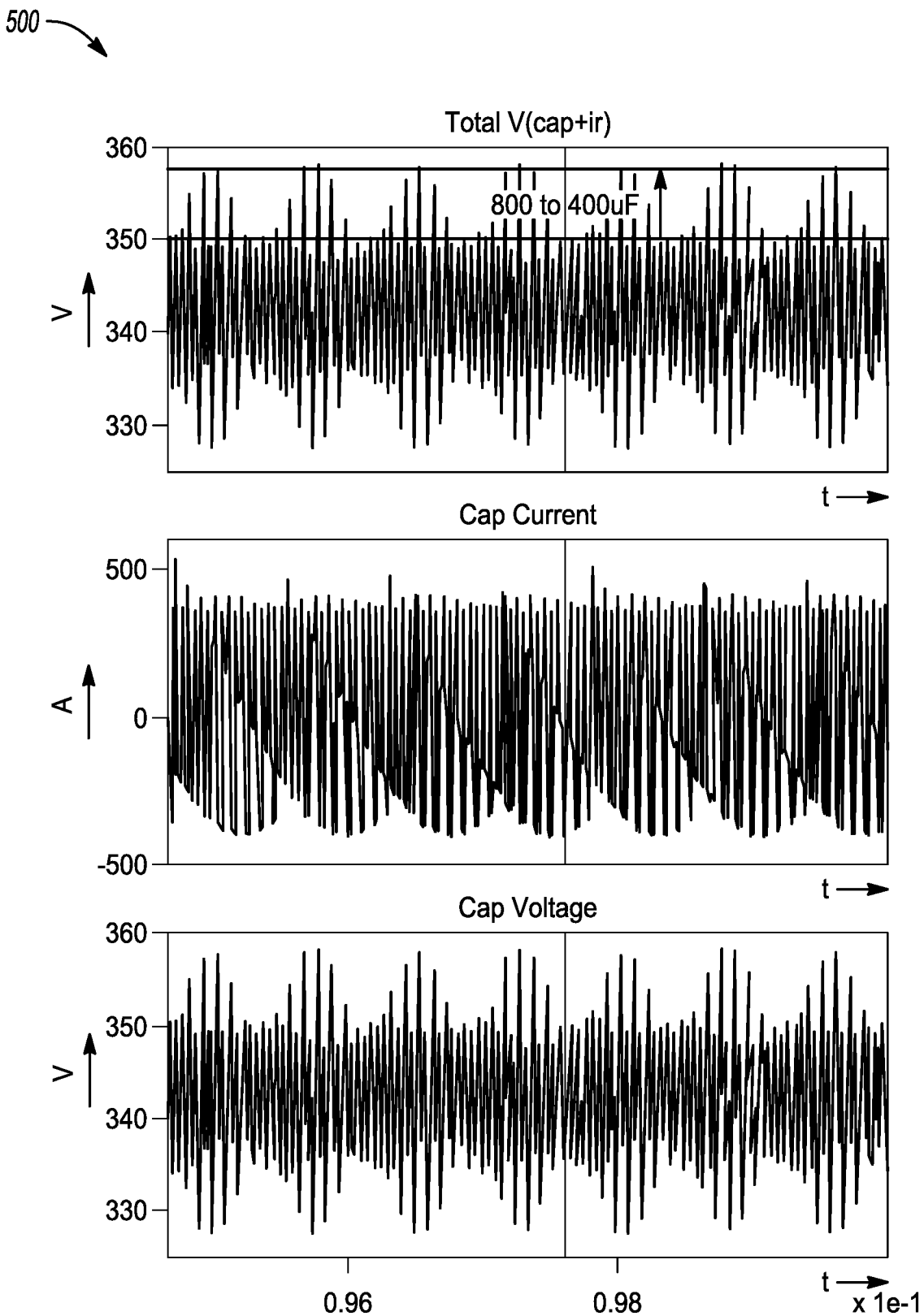
FIG. 5 is a series of three timing diagrams showing a DC torque ripple envelope across one of the inverter capacitors of FIG. 4, in accordance with various embodiments.

FIG. 5 is a series of three timing diagrams 500 showing a DC torque ripple envelope across one of the inverter capacitors of FIG. 4, in accordance with various embodiments. The various types of AC motors, including synchronous interior permanent magnet motors, synchronous reluctance motors, and the like, are all affected by torque ripple. Ideally, the design should produce a DC torque, with the voltage across the DC capacitor stabilized. However, various phenomena such as higher order slot harmonics and noise may add ripple. Here, as noted, the ripple envelope increases with the degradation of the capacitor.

The lowest graph on FIG. 5 shows the voltage versus time of capacitor 123 as received by the processor 114 at input 122. The middle graph on FIG. 5 shows the current through the capacitor in Amperes, with the vertical origin closer to the mid-point of the waveform and the negative current values meaning that the direction of the current has changed. The upper graph on FIG. 5 is similar to the lower graph but shows the total capacitor voltage, which shows that the capacitor voltage includes a small voltage drop due to a parasitic resistance.

The ripple is operating point dependent, meaning that the magnitude of the ripple depends on the value of the torque, the speed of the rotor, and the like. Often it is desirable to measure the changes in ripple at its worst case, such as by using the maximum operating speed and torque of the motor. During regular operation of the AC electric motor, the purpose of the capacitor is to provide a stable DC voltage source and eliminate high frequency components.

Referring specifically to the horizontal lines on the upper graph, the electric motor may be set at a desired operating point, which may be a maximum electric motor output, for example. The annotation on the upper graph notes that when the value of capacitor 123 was identified as 800 μFarads or close to its nominal value, the amount of ripple was lower, with a maximum high frequency ripple voltage reaching an upper value of about 350 volts. However, when the capacitance value is determined to be half its original value or 400 μFarads, the ripple increased by eight to nine volts to reach a maximum value of about 358 volts. The resistor degradation analysis is further described below with reference to FIG. 8.

Figure 6:
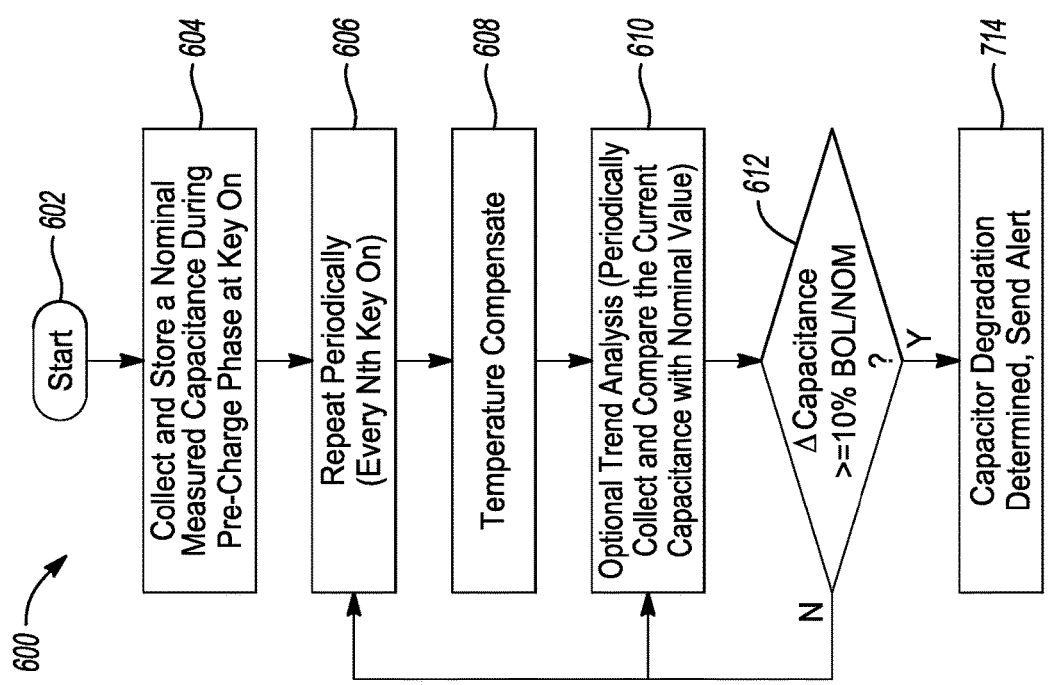
FIG. 6 is an exemplary flow diagram illustrating a capacitance analysis during a key on operation, and a corresponding degradation alert, in accordance with various embodiments.

FIG. 6 is an exemplary flow diagram 600 illustrating a capacitance analysis executed during a key on operation when the motor is turned on, and a corresponding degradation alert, in accordance with various embodiments. The various steps recited in FIGS. 6-8 may be performed by a processor 114 or any type of suitable dedicated hardware circuitry as described herein, or a hybrid combination of these elements. The steps may also be performed in software, firmware, middleware, or other instructions stored in a machine-readable medium and executed by one or more CPUs within the processor or controller. The processor constitutes plural or multiple processors in some embodiments.

Referring now to FIG. 6, upon start 602 of the analysis, the processor 114 proceeds at step 604 to collect and store data and to execute a time constant analysis or other similar analysis to determine a capacitance value of the capacitor 123 in the inverter 125. When the apparatus is first built, either empirical data, or data from a specification or data sheet and pertaining to the nominal and/or BOL capacitance value of capacitor 123 are collected and stored in the memory, e.g., a memory within processor or a discrete storage medium coupled to the processor. Values of the relevant resistors, including the precharge and discharge resistors, are also recorded in memory. The processor 114 or, if applicable, a switching controller 105 (within or outside of processor 114) may configure the switches in order to turn the motor on by establishing a connection between a resistor 111 and a positive or first output terminal of a battery 103. During a collection event in key on, the processor 114 may monitor the voltage across capacitor 123. The processor 114 may measure a time corresponding to a first time constant in some embodiments by monitoring the time period during which the resistor 111 is first connected to the capacitor 123 and battery 103 and when the rising capacitor voltage reaches a value equal to the product of the first time constant $\tau$ and the final voltage of the battery 103 (e.g., based on a pulse generated by a comparator for example, or otherwise based on software). Having determined the value of $\tau$ and having in memory the resistance of resistor 111, the processor 114 may simply use $Cd=\tau/Rd$ to compute the capacitance value.

Thereupon, a step 606, the processor 114 may automatedly repeat this collection step during some predetermined set of times, such as periodically. In some embodiments, the processor may perform the above analysis every nth time the motor is powered on, where n=10 or another number. At step 608, the processor 114 may use a temperature sensor to determine a temperature of the relevant portions of the apparatus that corresponds with a data retrieval, whether in step 604 or step 606. The processor 114 may then adjust the value of the determined capacitance if necessary to compensate for the measurements taken at different temperatures.

Optionally, at step 610, the processor 114 may conduct a trend analysis in which, in addition to or instead of simply repeating the measurement at every nth cycle, the processor 114 may instead periodically collect data during key on cycles and may compare every determined capacitance value of the capacitor 123 with a nominal value, accounting for temperature or other variables where necessary. This periodic data collection may enable the processor 114 to more quickly assess whether a trend is present in the capacitor, e.g., the capacitance value is progressively lowering, or whether no such trend is present. Beneficially, even absent an immediate trend, using the technique of repeating the measurements may enable the processor to discern a longer-term trend, e.g., involving a capacitor that is more slowly deteriorating.

Referring to step 612, the change in capacitance (e.g., the determined value versus a nominal value obtained from the factory or a beginning of life (BOL) value) may be monitored after each capacitance determination to assess whether the capacitance variation (if any) exceeds a threshold that is typically established during production of the apparatus. This step 612 may apply to both the periodic measurements 606 and the periodic measurements 610. In some embodiments, the periodic measurements may, prior to a comparison, be averaged or otherwise manipulated to produce an overall capacitance value established over a given time period. In other embodiments, each measurement is individually compared with nominal and/or BOL values to determine if the deviation meets or exceeds the threshold.

If, in 612, the change in the capacitance value meets or exceeds the target threshold, the processor 114 may determine that the capacitor 123 corresponding to the inverter 125 at issue needs replacement. Conversely, if the threshold is not met, control returns to 610 (optionally) or back to 606, where the process resumes, and periodic measurements are made at key on.

Figure 7:
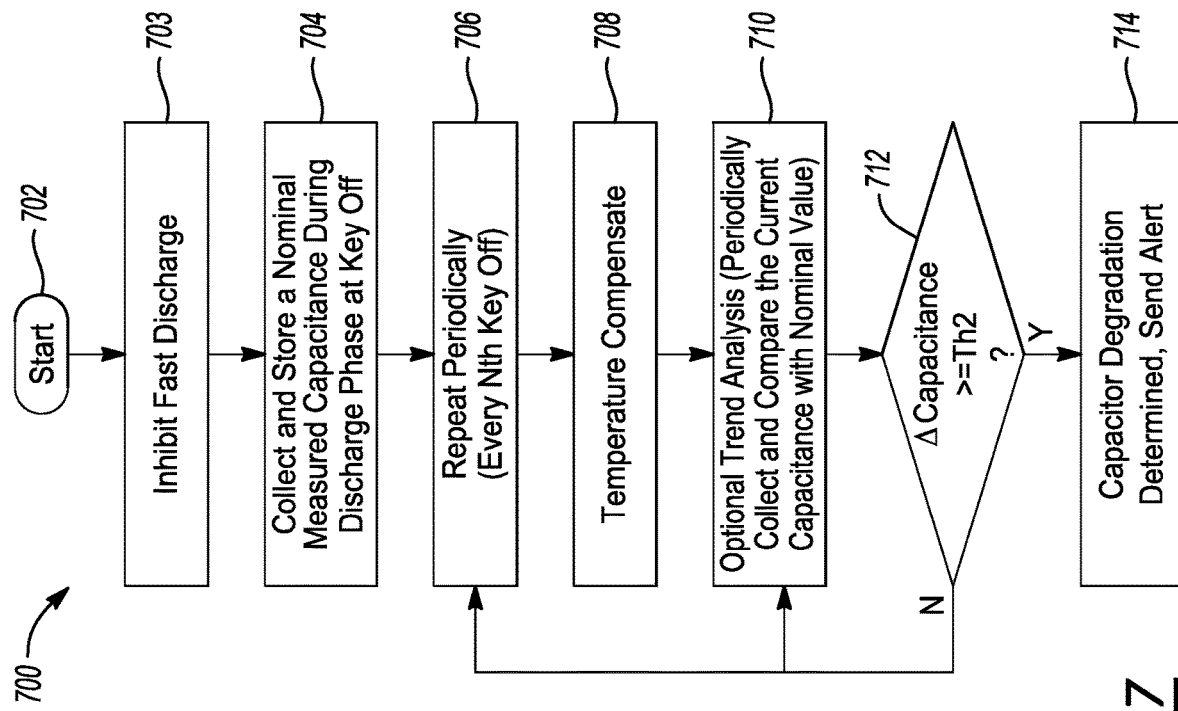
FIG. 7 is an exemplary flow diagram illustrating a capacitance analysis during a key off operation, and a corresponding degradation alert, in accordance with various embodiments.

Advantageously, some embodiments accord the apparatus an extra level of precision and confidence. This is obtained by also determining the capacitance value during key off, or when the motor is turned off. FIG. 7 is an exemplary flow diagram 700 illustrating a capacitance analysis during a key off operation, and a corresponding degradation alert, in accordance with various embodiments. After operating the AC electric motor for a period of time, the user may power off the motor. Referring to the start 702 of the process, one issue that is beneficially addressed in this process is first inhibiting a fast discharge through one or more of the motor windings at step 703. Such a phenomenon may potentially damage the motor. As a result, the apparatus may in various embodiments be configured with switches or other elements configured to prevent a fast discharge.

After the fast discharge is inhibited in step 703, the processor may proceed to switch the active inverter configuration to one where the battery 103 is disconnected and a resistor 121 is connected to the capacitor to allow the capacitor voltage to slowly be reduced from its initial battery value. After the capacitor voltage reaches about 36.8% of that initial value, a comparator may generate a pulse having a width equal to T. As in the example described above, the capacitor value may be determined by using the value of the discharge resistor and the time constant.

At step 706, the above technique may be repeated periodically to collect a number of capacitance values. After compensating as necessary for temperature variances at step 708, the apparatus optionally performs a trend analysis at step 710 by periodically performing the collect and compare steps to establish at the outset whether an adverse trend is present. In either case, at step 712, the measured capacitance (s) may be compared with a nominal or BOL value in memory to ascertain whether the capacitor is still performing in a satisfactory manner. The threshold ("Th2") may be the same threshold as in the key off version of FIG. 6, or it may be a different threshold. The processor 114 may alert the user if a new capacitor is needed.

In addition to comparisons with the nominal value, comparisons may be performed between the results realized in FIGS. 6 and 7. Matching results, whether or not adverse, suggest that the implemented solution is solid and robust. If the threshold is not met in step 712, control may return to either step 710 or to 706, as applicable.

Figure 8:
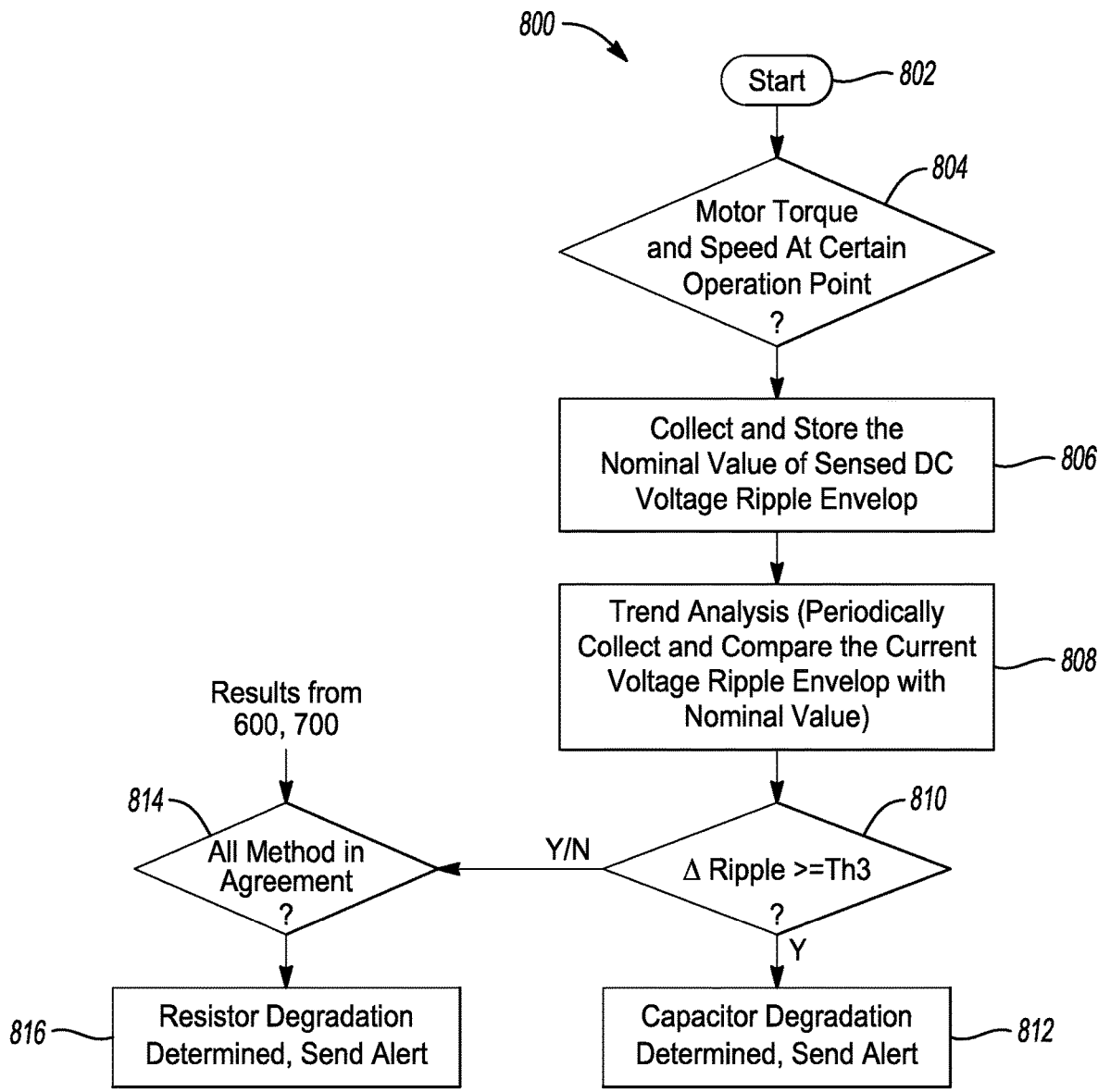
FIG. 8 is an exemplary flow diagram illustrating a capacitance analysis by detecting a DC torque ripple envelop, and mechanisms for determining capacitor and resistor degradation, in accordance with various embodiments.

FIG. 8 is an exemplary flow diagram 800 illustrating a capacitance analysis by detecting a DC torque ripple envelop, and mechanisms for determining capacitor and resistor degradation, in accordance with various embodiments. At the start 802 of the process, it is first determined at 804 whether the motor torque, speed, and potentially other criteria are at a desired operating point or at least within a target operating region. This determination may enable the processor 114 to determine ripple variance based on a potential worse case scenario. Once the correct operating point is achieved, at step 806, during motor operation (for example, the first and second terminals of the inverter are directly coupled to the first and second output terminals of the battery, respectively, the processor may proceed at step 806 to collect and store values of the capacitance. This step may be repeated periodically. In some embodiments, the circuit diagram 100 may be configured such that different capacitor values may be used by selectively switching the connection across the inverter to a selected capacitor in a bank of parallel capacitors. In this manner, the processor 114 may collect different values of a DC torque ripple envelope from the AC ripple voltage. The DC torque ripple envelope refers to a number identifying the maximum difference between upper and lower ripple values.

Like in prior embodiments, the processor 114 may optionally perform a trend analysis (step 808) at any stage in the period of use of the AC electric motor. This includes occasions where the circuit's ordinary periodic analysis may suggest a trend. Unlike in prior embodiments, this method is performed when the motor is operating. If the ripple envelope exceeds a third threshold, which may be the same or different as the other thresholds, the processor may issue an alert at step 812 identifying capacitor degradation.

In another aspect of the disclosure briefly mentioned above, the processor may further be configured to conduct a resistor degradation analysis. It may be the case, for example, that the capacitor is functioning properly and that it is one or both of the precharge and discharge resistors that are failing. Accordingly, in various embodiments, the processor 114 may conduct all three types of tests: (1) inverter capacitance via key-on (FIG. 6), (2) inverter capacitance via key-off (FIG. 7) and (3) inverter capacitance during motor operation. As shown in FIG. 8, the results from methods 600 and 700 are compared in step 814 with the results obtained from step 810, regardless of the relative failures or successes of those results. If all methods agree (e.g., all methods demonstrate that the capacitance values are the same or similar) but the apparatus is still functioning poorly or suffering from excessive ripple, problems at key on, or problems at key off, then the processor may deduce at step 814 that the problem lies with one or both of the precharge resistor or the discharge resistor. In this case, the processor may send a resistor degradation alert at step 816 instead and may indicate (if known) which resistor is malfunctioning. For example, the problems may only manifest themselves at key on, which suggests that the culprit is the precharge resistor. If power down results in unwanted spikes or faster-than-normal voltage transients, the problem may be with the discharge resistor.

In sum, the above methods, taken in concert, may be robust enough to not only assess the health of the inverter capacitor, but also to determine whether the resistors involved in power-up and power-down are functioning properly. The methods may be compared to narrow down the problem and issue the appropriate code for diagnostic purposes.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented above and below.

What is claimed is:

1. An apparatus, comprising:
a battery having first and second output terminals;
an inverter having terminals coupled respectively to the first and second output terminals, the inverter comprising a capacitor across the terminals and configured to power an electric motor;
a processor coupled to the inverter and configured to:
determine capacitance values of the capacitor during a plurality of precharge phases during which the electric motor is powered on;
determine whether a trend is present in the capacitance values, the trend indicating that a capacitance of the capacitor is rapidly changing relative to a threshold; and
generate an alert when the trend is present in the capacitance values.

2. The apparatus of claim 1, wherein the terminals comprise a first terminal selectively coupled to the first output terminal and a second terminal coupled to the second output terminal.

3. The apparatus of claim 2, wherein the processor includes a first input for receiving an input voltage across the terminals, the processor being further configured to:
switch the first output terminal to the first terminal via a precharge resistor,
determine the capacitance value based on:
a time between (i) switching the first output terminal from a disconnected state to the first terminal via the precharge resistor, and (ii) the input voltage rising from an initial value to an expected value at a first time constant; and
a resistance value of the precharge resistor.

4. The apparatus of claim 3, wherein the capacitance value $Cp=\tau/Rp$, where $\tau$ is the first time constant and Rp is the resistance value of the precharge resistor.

5. The apparatus of claim 3, wherein the processor is configured to determine a time at which the input voltage reaches the expected value at the first time constant.

6. The apparatus of claim 3, wherein the precharge phase is configured to begin when the processor switches the first output terminal from the disconnected state to the first terminal via the precharge resistor.

7. The apparatus of claim 6, wherein during the precharge phase, $V_{CAP}=V_{BAT}-V_{BAT}e^{-t/RpC}$, wherein
$V_{CAP}$ is a voltage across the first and second terminals of the capacitor;
$V_{BAT}$ is a voltage across the first and second output terminals of the battery;
Rp is a value of the precharge resistor; and
C is the determined capacitance value.

8. The apparatus of claim 1, wherein the processor is further configured to selectively modify each of the determined capacitance values based on a measured temperature when the processor determines whether the capacitor value is rapidly changing relative to the threshold so that appropriate corrective action may be taken.

9. The apparatus of claim 1, wherein the processor is configured to periodically determine the capacitance values of the capacitor during the precharge phase using ten kilohertz (10 kHz) measurement sampling.

10. An apparatus, comprising:
a battery having first and second output terminals;
an inverter having terminals coupled respectively to the first and second output terminals, the inverter comprising a capacitor across the terminals and configured to power an electric motor;
a processor coupled to the inverter and configured to:
determine a plurality of capacitance values of the capacitor during a discharge phase during which the electric motor is powered off;
determine whether a trend is present in the capacitance values, the trend indicating that a capacitance of the capacitor is rapidly changing relative to a threshold; and
generate an alert when the trend is present.

11. The apparatus of claim 10, wherein the terminals comprise a first terminal coupled to the first output terminal and a second terminal coupled to the second output terminal.

12. The apparatus of claim 11, wherein the processor includes a first input for receiving an input voltage across the terminals, the processor being further configured to:
switch a discharge resistor to connect between the first and second terminals,
determine the capacitance value based on
a time between (i) switching the discharge resistor to connect between the first and second terminals and (ii) the input voltage falling from an initial value to a final value at a first time constant, and
a resistance value of the discharge resistor.

13. The apparatus of claim 12, wherein the capacitance value $Cd=\tau/Rd$ where $\tau$ is the first time constant and Rd is the resistance value of the discharge resistor.

14. The apparatus of claim 12, wherein the discharge phase is configured to begin when the processor switches the discharge resistor to connect between the first and second terminals.

15. The apparatus of claim 14, wherein during the discharge phase, $V_{CAP}=V_I e^{-t/Rdc}$, wherein
$V_{CAP}$ is a voltage across the first and second terminals of the capacitor;
$V_I$ is the initial value of $V_{CAP}$ before the discharge resistor is switched to connect between the first and second terminals;
Rd is a value of the discharge resistor; and
C is the determined capacitance value.

16. The apparatus of claim 10, wherein the processor is further configured to inhibit a fast discharge through a motor winding when switching the discharge resistor to connect between the first and second terminals.

17. The apparatus of claim 10, wherein the processor is further configured to selectively modify each of the determined capacitance values based on a measured temperature when the processor determines that the capacitor value is rapidly changing relative to the threshold, so that appropriate corrective action may be taken.

18. An apparatus, comprising:
a battery having first and second output terminals for producing a direct current (DC) voltage;
an inverter having terminals coupled respectively to the first and second output terminals, the inverter comprising a capacitor across the terminals and configured to generate an alternating current (AC) for powering an AC electric motor; and
a processor coupled to the inverter and configured to:
identify an operating point of the motor including a motor torque and speed;
detect a DC voltage ripple envelope from the capacitor while the AC electric motor is at the operating point;
determine whether a trend is present in the DC voltage ripple during the precharge phase or the discharge phase, the trend indicating that a capacitance of the capacitor is rapidly changing relative to a threshold; and
generate an alert when the trend is present.

19. The apparatus of claim 18, wherein the processor is further configured to:
conduct a first comparison between a first measured value of the capacitor when the motor is powered up using a precharge resistor and a nominal value to determine if a first threshold is exceeded;
conduct a second comparison between a second measured value of the capacitor when the motor is powered down using a discharge resistor and the nominal value to determine if a second threshold is exceeded;
compare results of the first and second comparisons with the comparison of the DC ripple envelope to determine whether the three comparisons are in agreement;
identify a problem with the capacitor when the tests are in agreement; and identify a problem with the precharge or discharge resistors when the tests are not in agreement.

20. The apparatus of claim 19,
wherein the nominal value of the capacitor is either the same across the three comparisons, or different across at least two comparisons; and
wherein values of the threshold, the first threshold, and the second threshold are either all the same, or at least two are different.

* * * * *